United States Patent
Lu et al.

(10) Patent No.: US 12,315,548 B2
(45) Date of Patent: May 27, 2025

(54) BANK SELECTION FOR REFRESHING

(71) Applicant: Micron Technology, Inc., Boise, ID (US)

(72) Inventors: Yang Lu, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 397 days.

(21) Appl. No.: 17/871,752

(22) Filed: Jul. 22, 2022

(65) Prior Publication Data

US 2024/0029778 A1   Jan. 25, 2024

(51) Int. Cl.
  *G11C 11/406*   (2006.01)
  *G11C 16/34*    (2006.01)

(52) U.S. Cl.
  CPC ...... *G11C 11/40618* (2013.01); *G11C 11/406* (2013.01); *G11C 11/40622* (2013.01); *G11C 16/3418* (2013.01); *G11C 2211/4013* (2013.01); *G11C 2211/4062* (2013.01); *G11C 2211/4063* (2013.01)

(58) Field of Classification Search
  CPC ............ G11C 11/40618; G11C 11/406; G11C 11/40622; G11C 16/3418; G11C 2211/4013; G11C 2211/4062; G11C 2211/4063; G11C 16/0483
  See application file for complete search history.

(56) References Cited

U.S. PATENT DOCUMENTS

| | | |
|---|---|---|
| 6,967,885 B2 | 11/2005 | Barth, Jr. et al. |
| 8,284,615 B2 | 10/2012 | Shim |
| 8,295,115 B2 | 10/2012 | Kim et al. |
| 2020/0027500 A1* | 1/2020 | Heymann .............. G01K 13/00 |
| 2020/0135255 A1* | 4/2020 | Lo ....................... G06F 13/1636 |
| 2020/0341840 A1* | 10/2020 | Chang ................. G06F 13/1668 |
| 2023/0352074 A1* | 11/2023 | Gao .................. G11C 11/40607 |

OTHER PUBLICATIONS

JEDEC Standard No. 209-5C; dated Jun. 2023. Note, p. 278 was not changed from the previous 209-5B dated Jun. 2021 as evidenced by Appendix B and this citation has therefore been assigned the same priority date for this section as the 209-5B date. (Year: 2022).*

* cited by examiner

*Primary Examiner* — Donald H B Braswell
(74) *Attorney, Agent, or Firm* — Brooks, Cameron & Huebsch, PLLC

(57) ABSTRACT

In various examples, refreshing a bank can include receiving a refresh command, wherein the refresh command comprises selector bits and receiving mode register bits from the mode registers. Refreshing a bank can also include refreshing a number of banks from the plurality of banks utilizing the mode register bits and the selector bits.

17 Claims, 5 Drawing Sheets

| SDRAM COMMAND | TYPE | SDR CMD PIN | DDR COMMAND PINS | | | | | | | CK_t EDGE | NOTES |
|---|---|---|---|---|---|---|---|---|---|---|---|
| | | CS | CA0 | CA1 | CA2 | CA3 | CA4 | CA5 | CA6 | | |
| REFRESH (REF) | LP5 | H | L | L | L | H | H | H | L | R1 | |
| | | X | BA0 | BA1 | BA2 | RFM | SB0 | V | AB | F1 | |
| | LP5A1 | H | L | L | L | H | H | H | L | R1 | |
| | | X | BA0 | BA1 | BA2 | RFM | BA3 | RB0 | RB1 | F1 | |

| RB[1:0] | FUNCTION | COMMENTS |
|---|---|---|
| 00 | NO BA IGNORE. | REAL PER BANK REFRESH, N=1 |
| 01 | IGNORE BA[3], PAIRED BANK REFRESH | LP5 REFpb EQUIVALENT, N=2 |
| 10 | REFRESH DEFINED BY MR13[3:2] | QUAD OR PAIRED BANK REFRESH, N=4 OR 2 |
| 11 | IGNORE BA[3], ALL BANK REFRESH | LP5 REFab EQUIVALENT, N=16 |

| MR13[3:2] | FUNCTION |
|---|---|
| 00 | IGNORE BA[2], PAIRED BANK REFRESH, N=2 |
| 01 | IGNORE BA[2,3], QUAD BANK REFRESH, N=4 |
| 10 | IGNORE BA[1], PAIRED BANK REFRESH, N=2 |
| 11 | IGNORE BA[0], PAIRED BANK REFRESH, N=2 |

FIG. 2

BANK SELECTION FOR REFRESHING

TECHNICAL FIELD

Embodiments of the disclosure relate generally to memory sub-systems, and more specifically, relate to selecting banks for refreshing.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 2 is a block diagram of a refresh command in accordance with some embodiments of the present disclosure.

DETAILED DESCRIPTION

Figure 1:
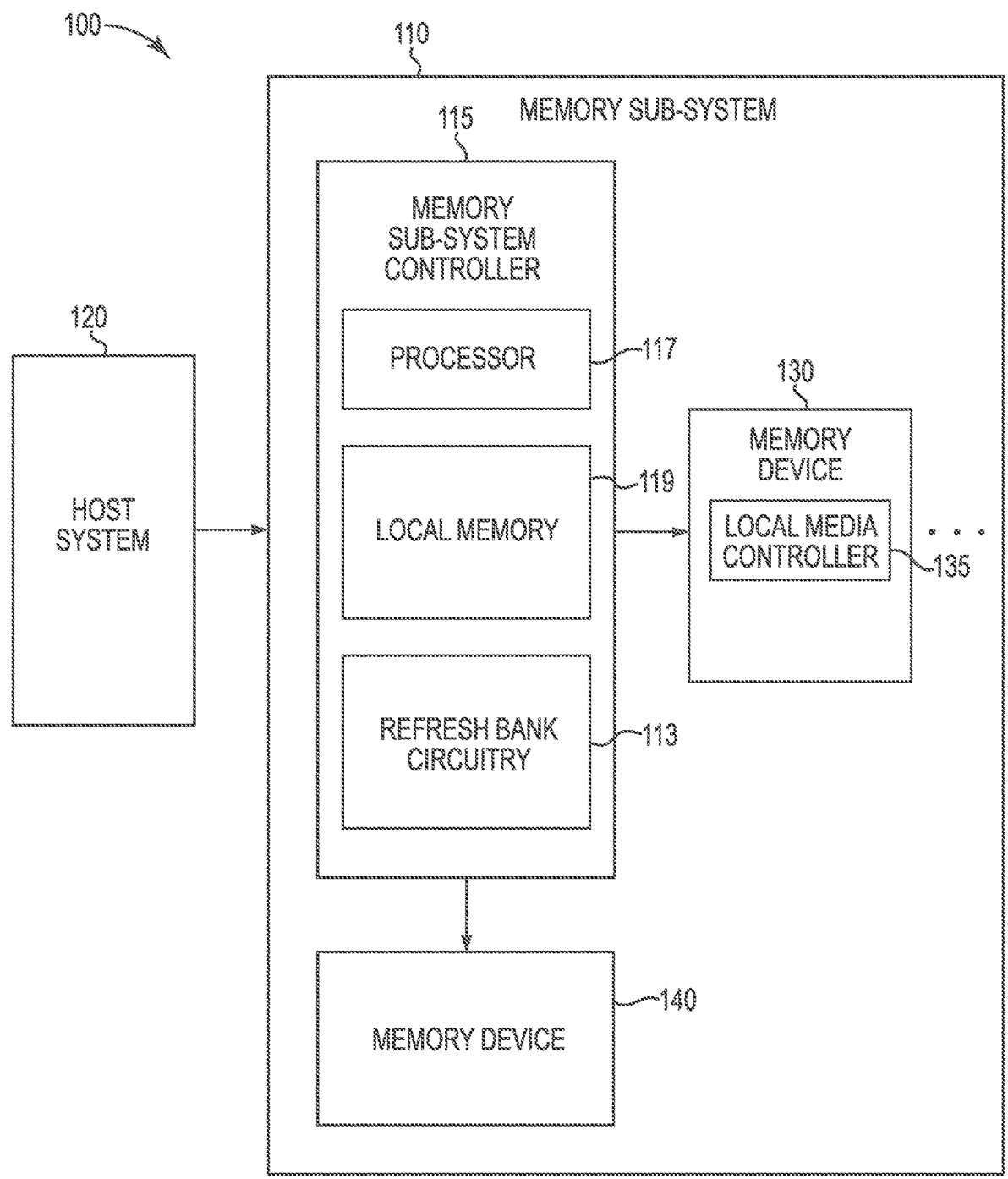
FIG. 1 illustrates an example computing system that includes a memory sub-system in accordance with some embodiments of the present disclosure.

Aspects of the present disclosure are directed to selecting and refreshing banks of a memory sub-system, in particular to memory sub-systems that includes refresh circuitry. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

The front-end (e.g., front-end interface) and/or the back-end of a memory sub-system can include circuitry to refresh banks of a memory sub-system. For example, the banks of the memory sub-system can be refreshed utilizing mode registers. In various memory sub-systems, the front-end of the memory sub-system can be connected to a media controller which can then access a variety of media types including DRAM, 3DXP, and/or NAND, among others (e.g., emerging memories). The media controller can be referred to as the back-end of the memory sub-system.

Refresh commands can be received by a memory sub-system. The refresh commands (e.g., REFab and REFpb) can be used to refresh each of the banks of a memory sub-system or refresh predefined limited pairs of the banks of the memory sub-system. The predefined limited pairs of the banks can include a limited quantity of pairs of the banks that are predefined and may not be changed (e.g., fixed). The pair of banks can share a same address.

Refreshing banks by predefined pairs of banks that share a same address can consumer resources. For example, if two banks are to be refreshed but the two banks are not included as pairs in the predefined bank pairs than multiple pairs of banks can be refreshed which can utilize more resources than if the two banks are refreshed.

Aspects of the present disclosure address the above and other deficiencies by expanding the predefined pair of banks that can be refreshed. For instance, the expanded predefined pairs of banks may not share an address. The expanded predefined pairs of banks can be described as being adjustably. The pairs of banks that are refreshed concurrently may be defined at run time, for example. The pairs of banks that are refreshed concurrently can be identified utilizing mode registers. As used herein, a mode register is a register that can be utilized to map a value to a plurality of banks. A host can program a mode register to define any mapping between address bits and a plurality of banks. For example, the mode register can map address bits to a single bank, a pair of banks, or three or more banks. In various example, the address bits may not correspond to one or more of the banks that the mode register maps to the address bits.

As used herein, refreshing memory can include reading information from an area of a memory device and revolting the read information to the same area without modification, for the purpose of preserving the information. Banks of a memory device can be refreshed by reading data from the banks and writing the data back to the banks for the purpose of preserving the information. In many instances, the data can be written back to the bank immediately after reading the data. Memory can be refreshed utilizing a background operation(s) and/or can be refreshed utilizing commands received from a host.

Memory can be refreshed to preservice data stored in the memory. The memory can store data utilizing memory cells. The memory cells can leak a charge, stored in the memory cells, over time. Over time, the data stored in the memory cells in the form of a charge can be lost due to a charge leaked. The data can be read and written back to the memory cells to restore the charge stored by the memory cells to prevent a loss of data. Memory may not be available while memory is refreshed. For example, the area of memory (e.g., bank of a memory device) may not be utilized to read or write data while the area of memory is refreshed.

Interfaces such as peripheral component interconnect express (PCIe), compute express link (CXL), cache coherent interconnect for accelerators (CCIX), etc. allow connecting a variety of memory devices to a host system. The combination of interfaces and memory technology improvements can allow for deploying "far memory", which can consist of system memory (e.g., memory devices) being implemented behind a front-end of a memory sub-system such as PCIe, CXL, CCIX, GenZ., etc. As used herein, the front-end of the memory sub-system can also be referred to as an interface of the memory sub-system or as a front-end of a controller of the memory sub-system. As used herein, the front-end of the memory sub-system can comprise hardware and/or firmware configured to receive data (e.g., requests and/or data) and provide the data to a back-end of the memory sub-system. The back-end of the memory sub-system can comprise hardware and/or firmware to receive the data (e.g., requests and/or data) from the front-end of the memory sub-system and can include perform the requests provided from the host on the memory devices of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, includes single level cells (SLC) which can store one bit per cell. Other types of memory cells, such as multi-level cells (MLCs), triple level cells (TLCs), quad-level cells (QLCs), and penta-level cells (PLC), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130).

In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a refresh bank circuitry 113. Although not shown in FIG. 1 so as to not obfuscate the drawings, the refresh bank circuitry 113 can include various circuitry to facilitate determining when to refresh a row of the memory devices 130, 140. In some embodiments, the refresh bank circuitry 113 can include special purpose circuitry in the form of an ASIC, FPGA, state machine, and/or other logic circuitry that can allow the refresh bank circuitry 113 to orchestrate and/or perform operations to selectively refresh bans of the memory devices 130, 140.

In some embodiments, the memory sub-system controller 115 includes at least a portion of the refresh bank circuitry 113. For example, the memory sub-system controller 115 can include a processor 117 (processing device) configured to execute instructions stored in local memory 119 for performing the operations described herein. In some embodiments, the refresh bank circuitry 113 is part of the host system 110, an application, or an operating system.

In a non-limiting example, an apparatus (e.g., the computing system 100) can include a memory sub-system refresh bank circuitry 113. The refresh bank circuitry 113 can be resident on the memory sub-system 110. As used herein, the term "resident on" refers to something that is physically located on a particular component. For example, the refresh bank circuitry 113 being "resident on" the memory sub-system 110 refers to a condition in which the hardware circuitry that comprises the refresh bank circuitry 113 is physically located on the memory sub-system 110. The term "resident on" can be used interchangeably with other terms such as "deployed on" or "located on," herein.

The refresh bank circuitry 113 can adjustably refresh a number of banks of the memory devices 130, 140. Refreshing banks adjustably describes the ability to refresh any bank in isolation or any combination of banks of the memory devices 130, 140. Refreshing banks adjustably is not limited to refreshing banks that share a same address but can include refreshing banks that share a same address.

Figure 3:
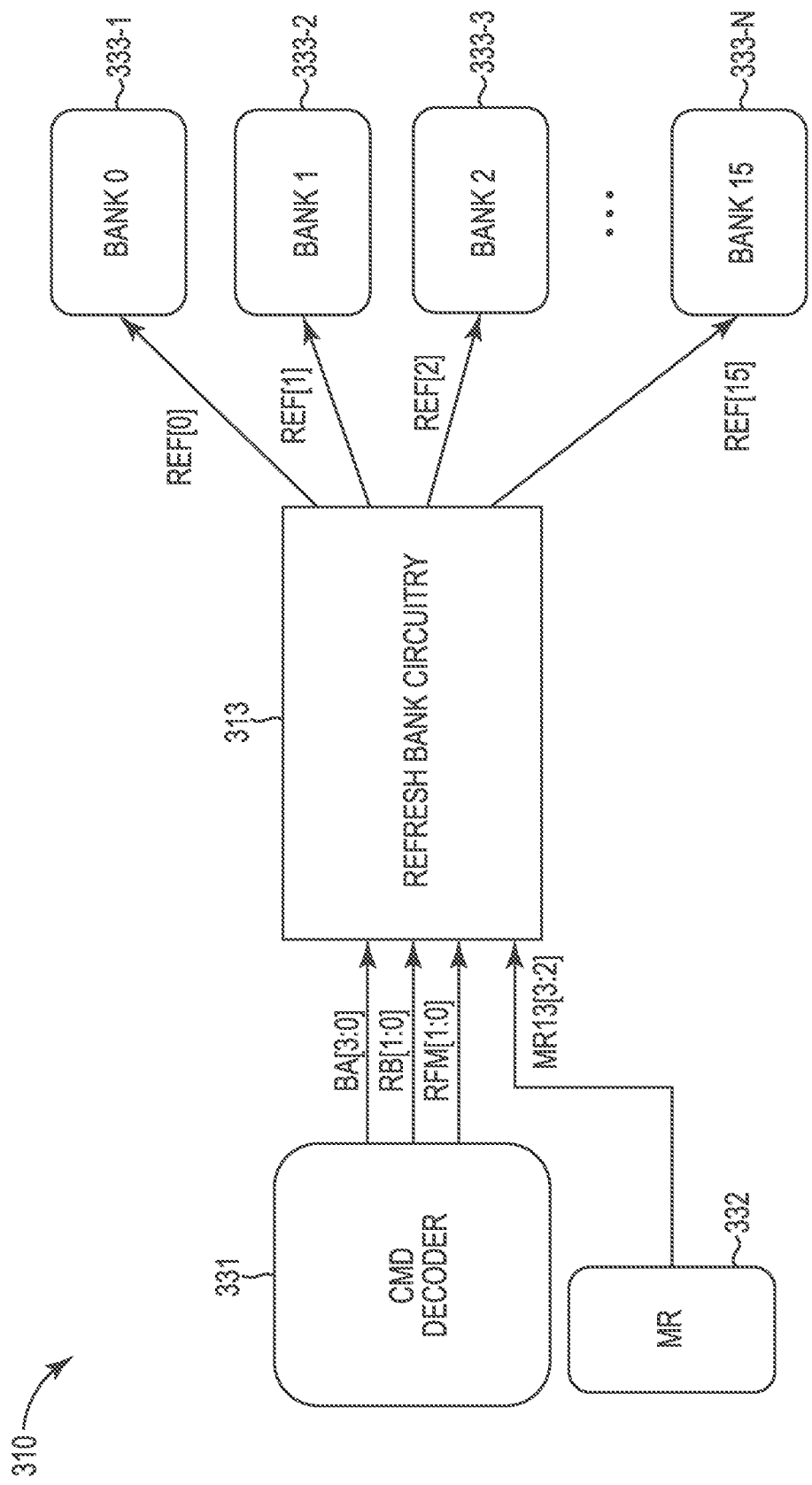
FIG. 3 is a block diagram corresponding to refresh bank circuitry in accordance with some embodiments of the present disclosure.

Banks can be refreshed adjustably utilizing commands received from the host 120 and/or utilizing mode registers (e.g., mode registers 332 of FIG. 3). Utilizing mode registers to select banks to refresh can allow a limited quantity of pins that are utilized to receive a refresh command to be utilized to select more banks to refresh than a quantity of pins that are available to convey the selection. For example, a single pin can be utilized to convey a selection (e.g., utilizing an address) of two banks that share an address or to convey a selection of all of the banks of a memory device for refreshing. However, the single pin in combination with a plurality of mode registers can be utilized to select any bank or any combination of banks of the memory devices for refreshing.

FIG. 2 is a block diagram of a refresh command 222 in accordance with some embodiments of the present disclosure. The refresh command 222 can also be referred to as refresh commands 222. The refresh command 222 can be any of different types of refresh commands. For example, the refresh command 222 can be a type 223-1 (e.g., LP5) or a type 223-2 (e.g., LP5A1), referred to generally as types 223. The different types 223 of refresh commands 222 can differ in how data is transferred through the pins 224-1, 224-2, 224-3, 224-4, 224-5, 224-6, 224-7, referred to generally as pins 224. As used herein, the pins 224 can comprise an interface of the memory sub-system used to couple the memory sub-system to the host.

The refresh command 222 of type 223-1 or type 223-2 can be provided from a host to a memory sub-system utilizing the pins 224 of the memory sub-system. The refresh command 222 of type 223-1 can be provided to the memory sub-system utilizing the pins 224-1, 224-2, 224-3 to transfer an address (e.g., BA0, BA1, BA2) of a bank and pin 224-7 to transfer data (e.g., AB) that identifies whether all banks of a memory device of the memory sub-system are to be refreshed or banks with the address provided are to be refreshed. Utilizing a refresh command 222 of type 223-1 limits the ability to select banks that do not share an address for concurrent refreshing.

The refresh command 222 of type 223-2 can be provided, at least partially, utilize the pins 224-1, 224-2, 224-3, 224-5 to transfer an address (e.g., BA0, BA1, BA2, BA3, referred to generally as BA bits) of a bank and pins 224-6, 224-7 to transfer data (e.g., RB0, RB1) that identifies whether to utilize a mode register or whether to refresh a number predefined banks. For instance, the data that identified whether to utilize a mode register or whether to refresh a number of predefined banks can be identified as RB data 225 or RB 225 for simplicity. The RB 225 can comprise a plurality of bits. The example of FIG. 2 utilizes two bits.

The bits of the RB data 225 can be mapped to any combination of banks. FIG. 2 shows an example of the mapping of the bits of the RB data 225 to a number of banks. For example, the can be mapped to a single bank. The 00-bits can be mapped to a bank identified utilizing the address comprising bits BA-0, BA-1, BA-2, BA-3 (e.g., the BA bits are not ignored) which are provided via pins 224-1, 224-2, 224-3, 224-4. The 00-bits can identify that a single bank is refreshed. The single bank can have an address comprised of the BA bits. Given that the bits BA-BA-1, BA-2, BA-3 of the type 223-2 refresh command 222 comprise more bits than address bits BA-0, BA-1, BA-2 of the type 223-1 refresh command 222, the BA bits of the type 223-2 refresh command 222 can identify a single bank while the BA bits of the type 223-1 refresh command 222 can only identify a pair of banks. The BA bits of the type 223-1 refresh command 222 can identify a pair of banks because the only a partial address is provided. The partial address excludes a bit that differentiates one of the banks from the other of the banks. The partial address can be utilized to refresh the pair of banks given that the pair of banks share the partial address.

The 01-bits of the RB 225 can be mapped to a pair of banks having an address comprising the bits BA-0, BA-1, BA-2. The 01-bits can identify that the BA-3 bit of the BA bits of the type 223-1 refresh command 222 is to be ignored. The 01-bits of the RB 225 of the refresh command 222 can be utilized to refresh a pair of banks that share the partial address comprising the bits BA-0, BA-1, BA-2. The address of the pair of banks identified using the 01-bits of the RB 225 can include the bits BA-0, BA-1, BA-2 which can be the same bits (e.g., LP5 REF pb equivalent) of the address having the bits BA-0, BA-1, BA-2 provided with the refresh command 222 being of type 223-1.

The 10-bits of the RB 225 can be mapped to banks identified utilizing mode registers 226. The 11-bits of the RB 225 can be mapped to all banks of a memory device such that all the banks of the memory device are refreshed concurrently. The 11-bits of the RB 225 can be utilized to identify all of the banks by ignoring the bits BA-0, BA-1, BA-2, BA-3 which includes ignoring the address provided with the type 223-2 refresh command (222). The mapping of bits of the RB 225 to different banks provided herein is exemplary and can deviate from said mappings shown in FIG. 2. For example, each of the bits of the RB 225 can be mapped to the mode registers in different mappings of the bits of the RB 225 to banks.

The mode register 226 can comprise a single mode register or a plurality of mode registers. For example, FIG. 2 shows a mode register that can store two bits. The two bits can be stored using a single mode register or multiple mode registers. In various examples, the mode register 226 can store more than two bits or less than two bits. The bits of the RB 225 can be mapped to the mode register 226 and nothing else or a single other mapping. For instance, the mappings of the bits of the RB 225 can map to the mode register 226 and to a single bank, a pair of banks, or all of the banks of a memory device.

The mode register 226 can store the 00-bits, 01-bits, 10-bits, or 11-bits. The 00-bits can be mapped to a pair of banks having an addressed comprised of the bits BA-0, BA-1, and BA-3. The mapping of the 00-bits to the pair of banks can ignore the BA-2 bit. The pair of banks can share a partial address where the BA-2 bit is missing. For example, a first address of a first bank can differentiate from a second address of a second bank in that the BA-2 bits are different while the bits BA-0, BA-1, and BA-3 as the same.

The mapping of the 01-bits, of the mode register 226, to a plurality of banks (e.g., four banks) can ignore multiple bits of the address of the plurality of banks. For example, the mapping of the 01-bits of the mode register 226 to the plurality of banks can ignore the bits BA-2, BA-3. The plurality of bits ignored from the address can identify a quantity of banks that are refreshed concurrently. For example, removing the bits BA-2 and BA-3 of the addresses of the plurality of banks can result in a partial address comprising the bits BA-0 and BA-1. The bits BA-0 and BA-1 can comprise a partial address can ban be used to identify four banks. Multiple bits of the address of the banks can be ignored to identify any combination of the plurality of banks of the memory sub-system. Any combination of the bits BA-0, BA-1, BA-2, and BA-3 can be ignored. Up to three bits of the addresses of the banks can be ignored to identify less than the entirety of the banks of the memory device. Each of the bits of the addresses of the banks can be ignored to identify all of the banks of the memory device.

The mapping of the 10-bits, of the mode register 226, to a pair of banks can ignore the bit BA-1. The pair of banks can share a partial address where the bit BA-1 is missing. For example, the first address of a first bank can differentiate from a second address of a second bank in that the BA-1 bits are different while the bits BA-0, BA0-2, BA-3 are the same.

The mapping of the 11-bits, of the mode register 226, to a pair of banks can ignore the bit BA-0. The pair of banks can share a partial address where the bit BA-0 is missing. For example, the first address of a first bank can differentiate from a second address of a second bank in that the BA-0 bits are different while the bits BA-1, BA0-2, BA-3 are the same.

While bits of the RB 225 are provided via the refresh command 222 of type 223-2, the bits stored in the mode register 226 are not provided via the refresh command 222 of type 223-2. The data stored in the mode registers 225 is provided and stored via a different command which is not a refresh command 222. The mode registers 225 can be programmed concurrently with receipt of the refresh command 222 of type 223-2 or prior to receipt of the refresh command 222 of type 223-2. For example, data can be stored in the mode registers 226 to program a mapping of banks to bits (e.g., data stored in the mode registers 226). The mapping of banks to bits stored in the mode registers 226 can be different for each refresh command 222 received or can be the same for each refresh command 222 received. Data stored in the mode register 225 can be received from a host. The command received to program the mode register 225 can also be received from the host.

Although the examples provided herein provide for a mapping of bits of the mode register 226 to banks in pairs such as two banks, four banks, eight banks, or sixteen banks, the bits of the mode register 226 can be mapped to a single bank, three banks, five banks, seven bank, nine banks, eleven banks, thirteen banks, fifteen banks, or any other number of banks. The mapping of the bits of the mode registers 226 can be based on the address provided with the type 223-2 refresh command 222. The mapping of the bits of the mode registers 226 can also be independent of an address. The mapping of bits of the RB 225 to banks can also be independent of an address provided with the type 223-2 refresh command 222 or a lack of an address provided with the type 223-2 refresh command 222.

FIG. 3 is a block diagram corresponding to refresh bank circuitry 313 in accordance with some embodiments of the present disclosure. FIG. 3 shows a memory sub-system 310 comprising refresh bank circuitry 313. The memory sub-system 310 also include a command decoder 331, mode register 332, and banks 333-1, 333-2, 333-3, . . . , 333-N, referred to generally as banks 333.

The command decoder 331 and/or the mode register 332 can be part of the memory sub-system controller (e.g., memory sub-system controller 115 of FIG. 1). The command decoder 331 and/or the mode register 332 can also be external to the memory sub-system controller but internal to the memory sub-system.

The command decoder 331 can comprise circuitry configured to decode a command received from a host. The command decoder 331 can receive commands from a plurality of pins of the memory sub-system. The command decoder 331 can decode the commands receive. For example, the command decoder 331 can decode a refresh command. Responsive to decoding the refresh command, the command decoder 331 can provide BA bits and RB bits to the refresh bank circuitry 313. The BA bits can define an address of one or more of the banks 333. The RB bits can be used to map the address to a number of banks 333 or to data stored in the mode register 332.

Responsive to resolving a mapping of the BA bits utilizing the bits of the RB, the refresh bank circuitry 313 can cause a number of banks 333 to be refreshed. In various examples, the BA bits may not be mapped to a number of banks 333 utilizing the bits of the RB without utilizing bits stored in the mode register 332. The refresh bank circuitry 313 can also receive bits from the mode register 332.

In various examples, the BA bits can be resolved to a number of the banks 333 utilizing the bits of the RB without utilizing the bits stored in the mode registers 332. Resolving BA bits to a number of banks without the use of the mode registers 332 can be faster than resolving the BA bits to a number of banks utilizing the mode registers 332. Utilizing the mode registers 332 can slow the refreshing of the banks 333 as opposed to refreshing the banks 333 without utilizing the mode registers 332. It may be beneficial to refresh the banks 331 without utilizing the mode registers 332. To avoid utilizing the mode registers 332 as much as possible, the combination of the banks 333 that are refreshed most often can be mapped to the BA bits utilizing the bits of the RB. The combination of banks 333 that are refreshed less often may be resolved utilizing the bits of the RB and the bits of the mode register 332.

Figure 4:
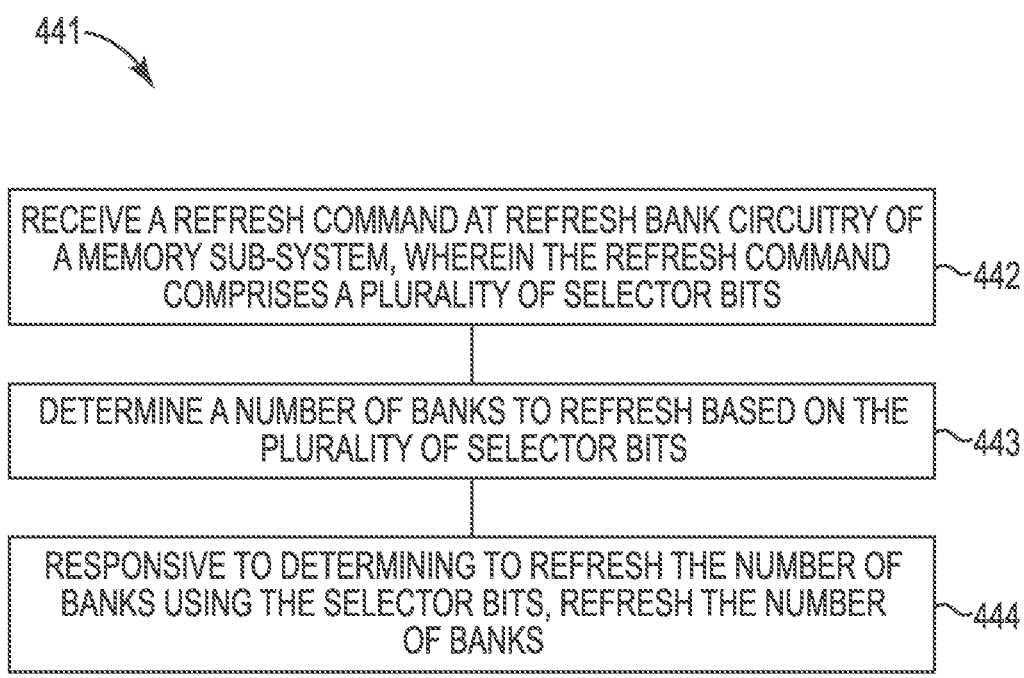
FIG. 4 is a flow diagram corresponding to a method for refreshing banks in accordance with some embodiments of the present disclosure.

FIG. 4 is a flow diagram corresponding to a method 441 for refreshing banks in accordance with some embodiments of the present disclosure. The method 441 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 441 is performed by the refresh bank circuitry 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 442, a refresh command can be received at refresh bank circuitry of a memory sub-system. The refresh command can be comprised of a plurality of selector bits. The selector bits are referred to herein as bits of the RB (e.g., the RB 225 of FIG. 2). The selector bits can be used to select a number of banks to refresh.

At operation 443, a number of banks can be determined based on the plurality of selector bits. The number of banks can correspond to a memory device of a memory sub-system. The single bank can be identified utilizing an address of the single bank and the plurality of selector bits. The address of the single bank can uniquely identify the single bank. The address of the single bank may not be shared with any other bank. The other banks may not have a same address (e.g., complete address) as the single bank. At operation 444, responsive to determining to refresh the number of banks using the selector bits, the number of banks can be refreshed.

The number of banks can be determined based on the plurality of selector bits and address bits corresponding to the number of banks. As mentioned, the address bits can uniquely identify the number of banks including a single bank. The address bits and the selector bits can be received with the refresh command such that the refresh command comprises the address bits and the selector bits. The address bits can uniquely identify a number of banks including a single bank if the address bits comprise four or more bits in examples were the plurality of banks of a memory device comprise 16 or more banks. If the plurality of selector bits have a first value, then the single bank can be determined utilizing the four or more address bits. In various examples, a plurality of banks can be identified utilizing less than the four or more address bits. For example, a pair of banks can be identified utilizing less than four address bits. The pair of banks can be identifies utilizing three of less address bits if the plurality of selector bits have a second value. In various examples, a number of banks can be identified utilizing three or less address bits if the plurality of selector bits have a third value. The selector bits can comprise two bits. The selector bits can also have more than two bits. The refresh command can be received comprising two or more selector bits.

In various examples, an apparatus can comprise mode registers, a plurality of banks of a memory device, and refresh bank circuitry. The refresh bank circuitry can be coupled to the banks and the mode registers. The refresh bank circuitry can receive a refresh command, where the refresh command comprises selector bits. Mode register bits can also be read from the mode registers. A number of banks can be refreshed from the plurality of banks utilizing the mode register bits and the selector bits.

In various examples, the refresh bank circuitry can determine whether a bit of the refresh command has a first value or a second value to determine whether the fresh command is of a first type or of a second type. The first type of refresh commands can determine whether to refresh a pair of banks or a all of the banks utilizing three address bits. The first type of refresh command can be defined under an LP5 protocol defined in section 7.5 of LP5 JEDEC. Section 7.5 of the LP5 JEDEC defines refresh operations. Section 7.1 defines command truth tables. Refresh management commands are defined under section 7.7.5.

Responsive to determining that the refresh command is of the first type, the number of banks from the plurality of banks can be refreshed utilizing a single selector bit. Responsive to determining that the refresh command is of the second type, the number of banks from the plurality of banks can be refreshed utilizing the mode register bits and the selector bits.

The refresh circuitry can refresh a first number of banks from the plurality of banks utilizing a first value of the mode register bits and a first value of the selector bits. The first number of banks from the plurality of banks can be refreshed utilizing the first value of the mode register bits, the first value of the selector bits, and a portion of a plurality of address bits. The first value of the mode register bits can identify a first bit of the plurality of address bits to not utilize. The first value of the mode register bits can indicate that the first bit of the plurality of address bits is to be ignored. The address utilized to access the number of banks can be a partial address if any of the bits of the plurality of address bits are ignored.

A second number of banks from the plurality of banks can be identified utilizing a second value of the mode register bits and the first value of the selector bits. Each of the different values of the mode register bits can be utilized to identify a different combination of banks for refreshing. The mode register bits can be references if a particular value of the selector bits is provided.

The second number of banks from the plurality of banks can be refreshed utilizing the second value of the mode register bits, the first value of the selector bits, and a different portion of the plurality of address bits. The second value of the mode register bits identifies that a second bit of the plurality of address bits is not utilized. In various examples, a single bank from the plurality of banks can be refreshed utilizing a second value of the selector bits. The second value of the selector bits can be reserved for identifying and refreshing a single bank from the plurality of banks. A third value of the selector bits can be utilized to refresh a third number of banks from the plurality of banks. The third number of banks can include all of the banks of a memory device or can include a different combination of banks than those identified utilizing the first value of the selector bits or the second value of the selector bits.

In various examples, the apparatus can comprise a mode register, a plurality of banks of a memory device, and refresh bank circuitry. The refresh bank circuitry can be coupled to the banks and the mode registers. The refresh bank circuitry can receive a refresh command. The refresh command can comprise selector bits. Mode register bits can also be received. The mode register bits can be received from the mode register. A number of banks from the plurality of banks can be refreshed utilizing the mode register bits and the selector bits. A particular value of the selector bits can be used to reference the mode register bits.

The mode registers can store the mode register bits prior to receipt of the mode register bits by the refresh circuitry. A command decoder can provide the selector bits what were received from a host. The mode register bits can be received by the refresh bank circuitry. Each value of the mode register bits can identify a different number of extraneous or superfluous address bits from the plurality of address bits received form the command decoder. The refresh bank circuitry can be configured to receive the mode register bits. The mode register bits can be programmed by the host. The mode register bits can identify a different quantity of extraneous or superfluous address bits.

Figure 5:
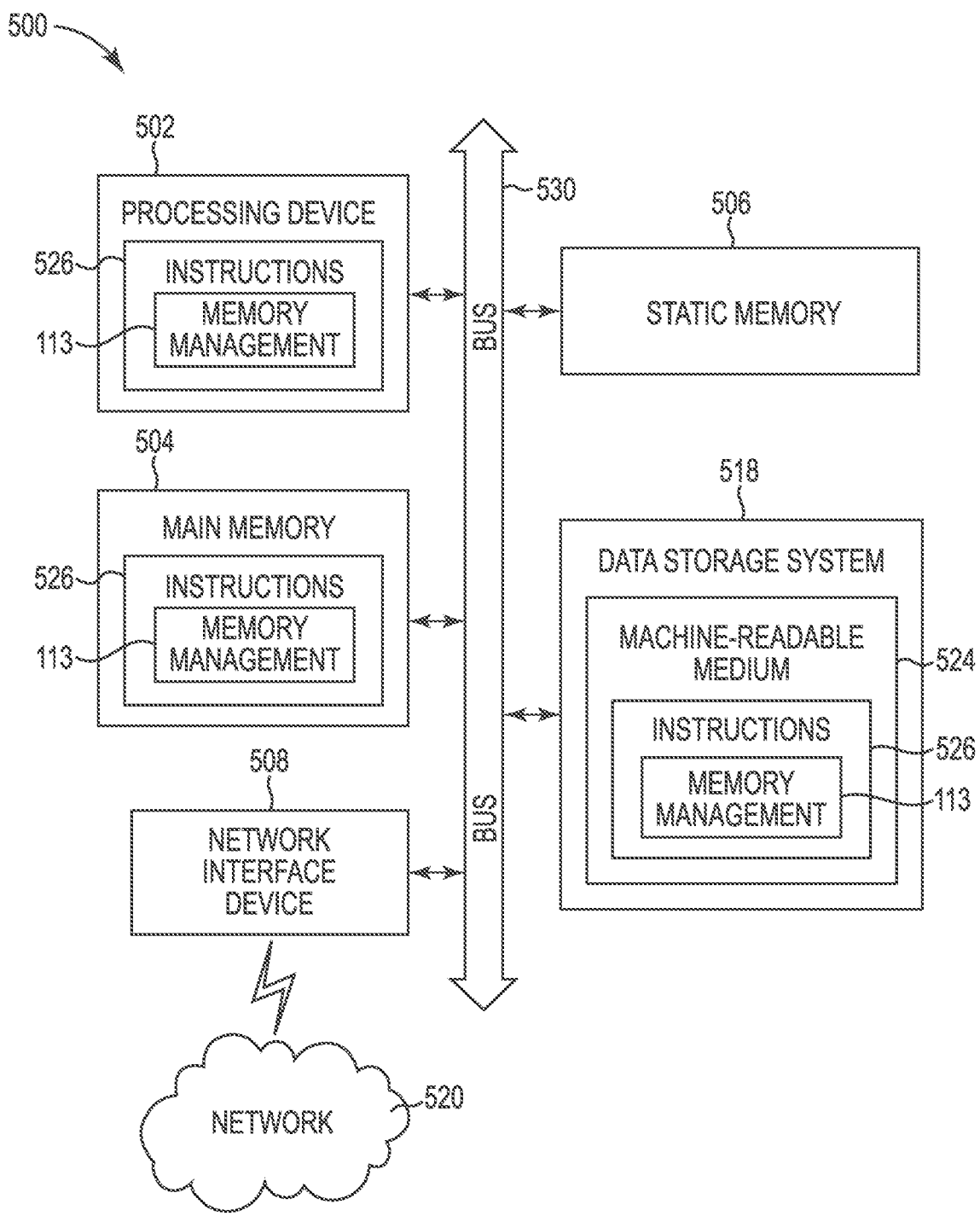
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the refresh bank circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a refresh bank circuitry (e.g., the refresh bank circuitry 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
   mode registers;
   a plurality of banks of a memory device; and
   refresh bank circuitry coupled to the plurality of banks and the mode registers and configured to:
      receive a refresh command, wherein the refresh command comprises selector bits;
      receive mode register bits from the mode registers; and
      refresh a number of banks from the plurality of banks utilizing the mode register bits and the selector bits, wherein a first number of banks from the plurality of banks are refreshed utilizing a first value of the mode register bits, a first value of the selector bits and a portion of a plurality of address bits, wherein the first value of the mode register bits identifies a first bit of the plurality of address bits to not utilize.

2. The apparatus of claim 1, wherein the refresh bank circuitry is further configured to determine whether a bit of the refresh command has a first value or a second value to determine whether the refresh command is of a first type or of a second type.

3. The apparatus of claim 2, wherein the refresh bank circuitry is further configured to:
   responsive to determining that the refresh command is of the first type, refresh the number of banks from the plurality of banks utilizing a single selector bit; and responsive to determining that the refresh command is of the second type, refresh the number of banks from the plurality of banks utilizing the mode register bits and the selector bits.

4. The apparatus of claim 2, wherein the first type of refresh commands is defined under a low power double data rate 5 (LP5) protocol defined in section 7.5 of LP5 Joint Electron Device Engineering Council (Jedec).

5. The apparatus of claim 1, wherein the refresh bank circuitry is configured to:
refresh the second number of banks from the plurality of banks utilizing the second value of the mode register bits, the first value of the selector bits, and a different portion of the plurality of address bits, wherein the second value of the mode register bits identifies that a second bit of the plurality of address bits is not utilized.

6. The apparatus of claim 1, wherein the refresh bank circuitry is configured to refresh a single bank from the plurality of banks utilizing a second value of the selector bits.

7. The apparatus of claim 1, wherein the refresh bank circuitry is configured to refresh a third number of banks from the plurality of banks utilizing a third value of the selector bits.

8. A method, comprising:
receiving a refresh command comprising a plurality of selector bits and address bits at refresh bank circuitry of a memory sub-system, wherein the refresh command comprises a plurality of selector bits, wherein the address bits comprise four or more address bits;
determining a number of banks to refresh based on the plurality of selector bits and the address bits corresponding to the number of banks wherein refreshing the number of banks further comprises refreshing a single bank; and
responsive to determining to refresh the number of banks using the selector bits, refreshing the number of banks.

9. The method of claim 8, further comprising determining the number of banks utilizing the four or more address bits based on a first value of the plurality of the selector bits.

10. The method of claim 8, further comprising determining a pair of banks from the number of banks utilizing less than the four or more address bits based on a second value of the plurality of selector bits.

11. The method of claim 8, further comprising determining the number of banks utilizing less than the four or more address bits based on a third value of the plurality of selector bits.

12. The method of claim 8, further comprising receiving the refresh command comprising two or more selector bits.

13. An apparatus, comprising:
mode registers;
a plurality of banks of a memory device;
refresh bank circuitry coupled to the plurality of banks and the mode registers and configured to:
receive a refresh command, wherein the refresh command comprises selector bits;
receive mode register bits from the mode registers; and
refresh a number of banks from the plurality of banks utilizing the mode register bits and the selector bits wherein a particular value of the selector bits is used to reference the mode register bits, wherein a number of banks from the plurality of banks are refreshed utilizing a first value of the mode register bits, a first value of the selector bits, and a portion of a plurality of address bits, wherein the first value of the mode register bits identifies a first bit of the plurality of address bits to not utilize.

14. The apparatus of claim 13, wherein the mode registers are configured to store the mode register bits prior to receipt of the mode register bits by the refresh bank circuitry.

15. The apparatus of claim 13, further comprising a command decoder configured to provide the selector bits.

16. The apparatus of claim 13, wherein the refresh bank circuitry is configured to receive the mode register bits, wherein each value of the mode register bits identifies a different number of extraneous or superfluous address bits from a plurality of address bits.

17. The apparatus of claim 16, wherein the refresh bank circuitry is configured to receive the mode register bits, wherein the mode register bits identify a different quantity of extraneous or superfluous address bits.

* * * * *